(12) United States Patent
He

(10) Patent No.: US 7,447,246 B2
(45) Date of Patent: Nov. 4, 2008

(54) Q-MODULATED SEMICONDUCTOR LASER

(76) Inventor: Jian-Jun He, 40 College Circle, Ottawa (CA) K1K 4R8

( * ) Notice: Subject to any disclaimer, the term of this patent is extended or adjusted under 35 U.S.C. 154(b) by 123 days.

(21) Appl. No.: 11/161,294

(22) Filed: Jul. 28, 2005

(65) Prior Publication Data
US 2006/0088066 A1 Apr. 27, 2006

Related U.S. Application Data

(60) Provisional application No. 60/622,326, filed on Oct. 27, 2004.

(51) Int. Cl.
*H01S 3/10* (2006.01)
(52) U.S. Cl. ............... 372/26; 372/10; 372/20
(58) Field of Classification Search ............ 372/20, 372/26
See application file for complete search history.

(56) References Cited

U.S. PATENT DOCUMENTS

| | | | |
|---|---|---|---|
| 4,558,449 A | 12/1985 | Gordon | |
| 4,667,331 A | 5/1987 | Alferness | |
| 5,455,836 A | 10/1995 | Li | |
| 6,215,805 B1 * | 4/2001 | Sartorius et al. | 372/50.1 |
| 6,330,265 B1 * | 12/2001 | Kinoshita | 372/50.12 |
| 6,351,482 B1 | 2/2002 | Puzey | |
| 6,519,270 B1 | 2/2003 | Kim | |
| 6,628,690 B1 * | 9/2003 | Fish et al. | 372/50.1 |
| 6,778,565 B2 | 8/2004 | Spuehler | |
| 6,822,980 B2 * | 11/2004 | Lundqvist | 372/20 |
| 2003/0218119 A1 * | 11/2003 | Stegmuller | 250/214.1 |
| 2004/0028105 A1 * | 2/2004 | Peters | 372/50 |
| 2004/0099856 A1 * | 5/2004 | Bour et al. | 257/11 |

\* cited by examiner

*Primary Examiner*—Minsun Harvey
*Assistant Examiner*—Yuanda Zhang

(57) ABSTRACT

A Q-modulated semiconductor laser comprises an optical gain section and an electro-absorptive modulator section, separated by a vertically etched air gap acting as a partially reflecting mirror. The modulator section is placed inside an anti-resonant Fabry-Perot cavity and acts as the rear reflector of the laser. The change of the absorption coefficient in the modulator section results in a change in the Q-factor of the laser, and consequently the lasing threshold and output power. Different embodiments are disclosed, which involve a distributed feedback (DFB) laser, a Fabry-Perot laser, a distributed Bragg reflector (DBR) laser, or a wavelength switchable multi-cavity laser. The integrated Q-modulated laser has advantages of high speed, high extinction ratio, low wavelength chirp and low cost.

20 Claims, 19 Drawing Sheets

Q-MODULATED SEMICONDUCTOR LASER

RELATED APPLICATIONS

This application claims benefit from U.S. Provisional Patent Application Ser. No. 60/622,326, filed on Oct. 27, 2004, entitled "Q-modulated semiconductor laser".

FIELD OF THE INVENTION

This invention relates generally to semiconductor lasers and modulators, and more particularly to semiconductor lasers monolithically integrated with a Q-modulator that changes the reflectivity of one of the reflectors of the laser cavity through current injection or electro-absorption effect.

BACKGROUND OF THE INVENTION

High-speed semiconductor lasers and modulators are essential components in today's fiber-optic communication systems. The rapid increase in internet traffic has demanded these optical components to be able to handle greater bit rates. Direct amplitude modulation by varying the bias current of the laser is the simplest method, without a need for a separate modulator. However, the directly modulated laser has fundamental speed limits, and will display transient oscillation at a frequency equal to its relaxation oscillation frequency. Wavelength chirp is another problem arising in directly modulated lasers. As the input drive current of a laser changes, so does the carrier density, hence refractive index, and therefore wavelength. The laser wavelength moves in opposite directions respectively as the pulse rises and falls. The higher the bit rate, the more the chirp begins to manifest itself as an effective widening of the laser linewidth. Due to chromatic dispersion in optical fibers, pulse spreading is more severe in the case of a wider laser linewidth, thereby limiting the transmission distance.

It is also highly desirable to have semiconductor lasers that is tunable or wavelength-switchable for dynamically reconfigurable networks. However, the phase change associated with the direct modulation often interferes with the wavelength tuning mechanism and the stability of the laser.

It is possible to keep the laser in continuous wave (CW) operation, and modulate it externally. This would eliminate the aforementioned problem of transient oscillation, and reduce the chirp, provided that the modulator suffers from less severe chirp than the laser. An electroabsorption modulator (EAM) is a viable option as an external modulator. Some of its advantages compared to other alternatives are: low cost, low drive voltages, small size, and the ability to be monolithically integrated with distributed feedback (DFB) or distributed Bragg reflector (DBR) lasers. An EAM is based on a very similar structure to the laser, with an active layer of a slightly different bandgap energy. Another difference is that it is operated in reverse bias. As the input stream of data bits alters the modulator reverse bias, the absorption coefficient of the modulator changes, thus varying the transmitted optical power.

Although the EAM improves the chirp performance considerably compared to direct modulation of the laser, the chirp problem remains due to refractive index change intrinsically associated with the modulation of absorption coefficient. More importantly, the modulator chirp is dynamic and changes with the actual drive voltage. Electro-absorption modulators now provide modulation capability up to about 10 Gb/s. At the moment it is not clear that electro-absorption modulators can reach higher speed (e.g. 40 Gb/s) without introducing considerable parasitic phase modulation.

Another possibility to modulate light is to use a Mach-Zehnder interferometer in a material showing strong electro-optic effect (such as $LiNbO_3$). By applying a voltage the optical signal in each path is phase modulated as the optical path length is altered by the electric field. Combining the two paths with different phase modulation converts the phase modulation into intensity modulation. If the phase modulation is exactly equal in each path but different in sign, the modulator is chirp free, this means the output is only intensity modulated without parasitic phase or frequency modulation. However, such an external modulator is very expensive.

With the deployment of fiber-to-the premise (FTTP) technology for broadband access and the spread of dense wavelength division multiplexing (DWDM) in metro and local networks, low-cost semiconductor lasers and modulators have become more and more important. Fabry-Perot lasers are commonly used in access and enterprise networks, as well as in fiber channels for storage area networks. The dynamic wavelength stability of Fabry-Perot lasers has significant impact on the transmission distance, especially when multimode optical fiber is used for some of those applications. It is therefore highly desirable to have a high-speed low-cost modulator that causes little wavelength chirp or instability of the laser, not only for long-haul and metro applications, but also for access and enterprise networks.

It is an object of the present invention to provide a semiconductor laser monolithically integrated with a high-speed low-chirp modulator which features low-cost and fabrication simplicity similar to that of a directly modulated laser.

SUMMARY OF THE INVENTION

In accordance with the invention, there is provided, a Q-modulated semiconductor laser comprising:

a front facet from which the output power emits, a first resonant optical cavity containing a first optical waveguide sandwiched between a pair of electrodes for injecting current to provide optical gain, a rear reflector consisting of a second substantially anti-resonant optical cavity coupled to the first resonant optical cavity through a partially reflecting element, said second substantially anti-resonant optical cavity comprising a second optical waveguide sandwiched between a pair of electrodes for providing an electrical signal to change the optical loss of said second optical waveguide, and consequently to modulate the threshold and the output power of the laser.

In accordance with another embodiment of the invention, there is provided, a Q-modulated semiconductor laser comprising:

a first optical waveguide sandwiched between a first pair of electrodes for injecting current to provide optical gain, said first optical waveguide having a distributed feedback grating incorporated in its layer structure, a second optical waveguide connected to the first optical waveguide, said second optical waveguide being sandwiched between a second pair of electrodes for providing an electrical means to adjust the effective refractive index of said second optical waveguide, a third optical waveguide placed inside a substantially anti-resonant optical cavity formed by two partially reflecting elements, said third optical waveguide being coupled to the second optical waveguide through one of said two partially reflecting elements, and said third optical waveguide being sandwiched between a third pair of electrodes for applying an electrical signal to change the optical loss of said third optical waveguide so that the output power of the laser is modulated by said electrical signal.

DETAILED DESCRIPTION

Figure 1:
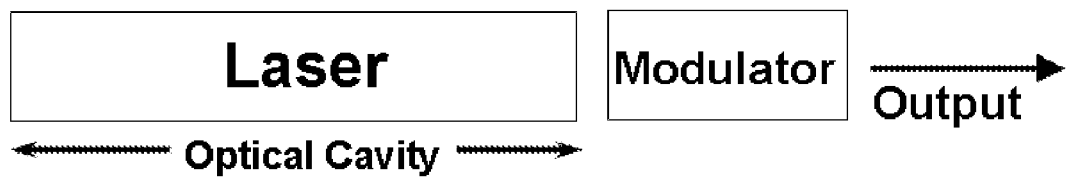
FIG. 1 is a schematic diagram of a prior-art semiconductor laser modulated by an external modulator or an integrated electro-absorption modulator.

FIG. 1 is a schematic diagram of a prior-art semiconductor laser modulated by an external modulator or an integrated electro-absorption modulator. The modulator is placed in front of the laser. In the case of an electro-absorption modulator, an electrical signal is applied on the modulator to change its absorption coefficient. The output beam of the laser traverses through the modulator with a low loss when the modulator is in the on-state and is mostly absorbed when the modulator is in the off-state. In the case of a modulator based on Mach-Zehnder interferometer, the modulator is turned on and off by changing the refractive index and consequently the phase in one arm of the interferometer. An example of such devices is described in U.S. Pat. No. 4,558,449 by E. I. Gordon, issued on Dec. 10, 1985.

Figure 2:
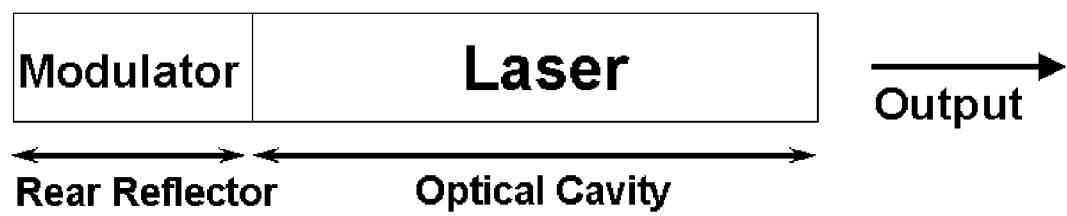
FIG. 2 is a generic schematic diagram of the semiconductor laser monolithically integrated with a Q-modulator in accordance with the present invention.

FIG. 2 is a generic schematic diagram of the semiconductor laser monolithically integrated with a Q-modulator in accordance with the present invention. The modulator is located in the rear reflector of the laser cavity. By varying the absorption coefficient of the modulator waveguide through a current injection or electro-absorption effect, the reflectivity of the rear reflector is changed, resulting in the modulation of the laser threshold and output power. This modulation scheme is applied to distributed feedback (DFB), distributed Bragg reflector (DBR) and Fabry-Perot (FP) based semiconductor lasers according to novel embodiments disclosed in the present invention.

The Q factor or quality factor of an optical resonator of a laser is a measure of how much light from the gain medium of the laser is fed back into itself by the resonator. A high Q factor corresponds to low resonator losses per roundtrip, and vice versa. The basis of Q-modulation is the use of a device which can alter the Q factor of the resonator. This has been implemented in Q-switched dye or solid state lasers for generating short periodic pulses. The commonly used prior art methods for the Q-switching include the use of a rotating mirror, or an electro-optic or acousto-optic modulator inside the optical cavity.

For the modulation of a semiconductor laser, reducing wavelength chirp is a very important consideration. Placing a modulator inside the resonant laser cavity, as described in U.S. Pat. No. 4,667,331 by R. C. Alferness et al, issue on May 19, 1987, is not a viable method because it will introduce a large wavelength chirp similar to a directly modulated laser, in addition to fabrication complexity.

In U.S. Pat. No. 6,519,270 by H. B. Kim and J. J. Hong, issue on Feb. 11, 2003, a compound cavity laser formed by a single mode DFB laser integrated with a passive waveguide section is described. The refractive index of the passive waveguide is modulated to cause a phase modulation in the effective reflectivity of the rear cleaved facet of the passive waveguide, resulting in frequency modulation of the laser. The frequency modulated light is then converted into intensity modulated light by using an additional narrow band optical filter such as a Mach-Zehnder interferometer in the front of the laser. While the modulator is placed at the rear end of the laser, it does not change the Q-factor of the laser but only the phase, resulting in frequency modulation. The need for a narrow band filter to convert frequency modulation into intensity modulation makes it impractical to use in common communication systems. The required active-passive waveguide integration also makes the device fabrication difficult and costly.

In an article entitled "Q-modulation of a surface emitting laser and an integrated detuned cavity", S. R. A. Dods, and M. Ogura, IEEE Journal of Quantum Electronics, vol. 30, pp. 1204-1211, 1994, a vertical cavity surface emitting laser with a vertically integrated detuned resonant cavity is described and analyzed. Intensity modulation of the laser is achieved by changing the refractive index inside the detuned resonant cavity. The same principle is used in U.S. Pat. No. 6,215,805 by B. Sartorius and M. Moehrle, issued on Apr. 10, 2001. In both of the above two prior arts, one of the reflectors of the laser cavity is a slightly detuned resonant cavity. Its reflectivity is highly dispersive at the operating wavelength of the laser, i.e. its reflectivity spectrum exhibits a sharp negative peak near the laser wavelength. This high reflectivity dispersion is necessary so that a small refractive index change in the slightly detuned resonant cavity can cause a large reflectivity change of the reflector, thus leading to the modulation of the laser. However, these prior art methods present significant drawbacks: 1) the reflectivity is highly wavelength dependent near resonance condition, thus requiring precise wavelength alignment with a predetermined detuning between the two resonant cavities, which is very difficult and fabrication sensitive; and 2) the reflectivity change caused by the refractive index change in the detuned resonant cavity is accompanied by a large phase change, which results in a large wavelength chirp of the laser.

The present invention overcomes the drawbacks of prior art methods by using an anti-resonant cavity as the rear reflector of the laser whose reflectivity is varied by changing the optical absorption inside the anti-resonant cavity. The reflectivity of the anti-resonant cavity as well as its variation caused by optical loss modulation has much less wavelength dependence as compared to those of a resonant cavity. It also produces very little phase change when the reflectivity is modulated, thus resulting in a very low wavelength chirp. The optical loss variation can be achieved by current injection using the same material as the laser gain medium, thus greatly simplifying the fabrication. The details of the monolithic Q-modulated semiconductor laser structures that implement the above mechanism are disclosed below.

Figure 3:
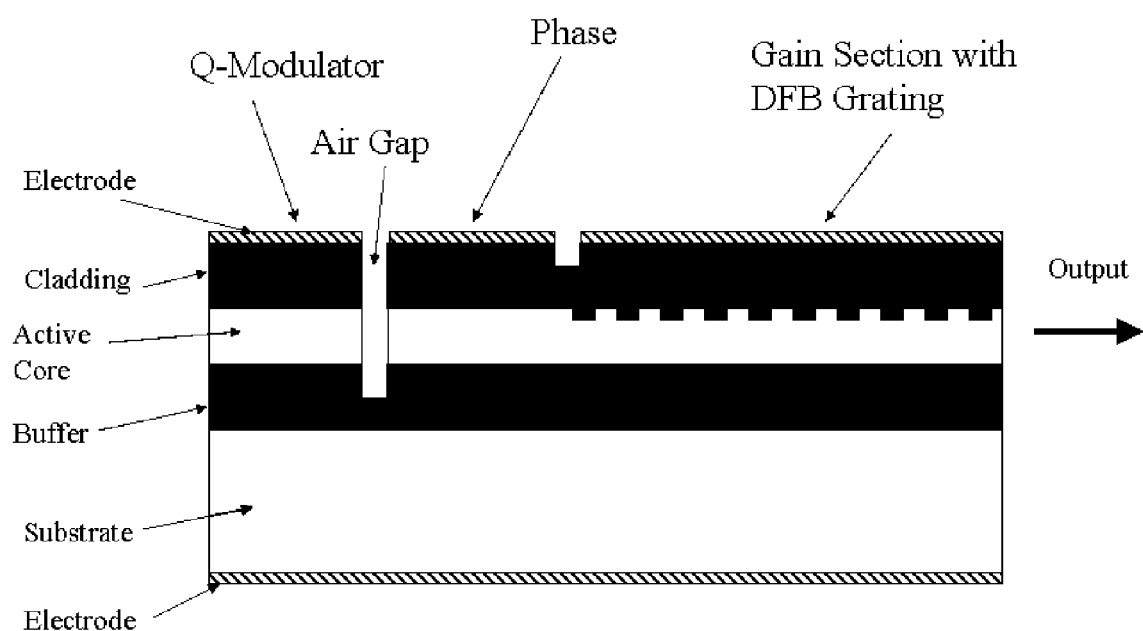
FIG. 3 is a schematic drawing of a Q-modulated semiconductor laser in accordance with one embodiment of the present invention.

FIG. 3 shows a single-mode distributed feedback semiconductor laser monolithically integrated with an electro-absorptive Q-modulator in accordance with one embodiment of the present invention. The laser comprises a front facet where the output power emits, a rear reflector, a distributed feedback (DFB) grating etched into the active region to stabilize the frequency of the laser for single-mode operation, and a phase section. The Q-modulator is incorporated in the rear reflector which consists of an etched air trench, a cleaved facet (or another etched trench) and an electro-absorptive (or current injection) waveguide in-between. The air trench and the cleaved facet (or another etched trench) constitute an anti-resonant Fabry-Perot cavity whose reflectivity can be changed by varying the waveguide absorption within the cavity. The operation principle of the laser without the modulator section is similar to a structure described by J.-J. He and M. Cada in a paper entitled "Phase-matched combined distributed-feedback/Fabry-Perot structure for semiconductor lasers", Optics Communications, vol. 110, pp. 115-119, 1994. Preferably the DFB grating is partially gain-coupled to improve the single-mode properties of the laser. Generally (but not necessarily), the front facet is cleaved and can be optionally anti-reflection coated to minimize the effect of random reflection phase with respect to the grating.

The waveguide structure generally consists of a buffer layer, a waveguide core layer that also provides an optical gain when electrically pumped, and an upper cladding layer, deposited on a substrate. Preferably the waveguide core layer comprises multiple quantum wells as in conventional laser structures and the layers are appropriately doped. In the transverse direction, standard ridge or rib waveguides are formed to laterally confine the optical mode. An electrode layer is deposited on the top surface in the laser, modulator and phase sections. The backside of the substrate is also deposited with another metal electrode layer as a ground plane. The electrodes provide a means for injecting current to produce an optical gain in the active laser section. In the modulator section, the electrodes are used to apply an electrical means (either a current injection or a reverse biased voltage) to change the absorption coefficient of the waveguide and consequently to change the reflectivity of the rear reflector. In the phase section, an electrical means is applied to make the waveguide substantially transparent and to adjust the refractive index of the waveguide so that the reflecting phase of the rear reflector is matched with respect to the grating phase for the lasing mode in order to achieve the lowest lasing threshold and the highest side-mode suppression ratio.

The waveguide materials for the three sections may be different so that the structure is optimized for each individual section of a different functionality. This can be done by using the etch-and-regrowth technique or a post-growth bandgap engineering method such as quantum well intermixing. A simpler alternative is to use the same laser structure with different operating voltage/current to obtain different properties for the three sections.

A critical element of the device of the present invention is the deep and vertical air trench acting as a partial reflecting element. It forms an anti-resonant cavity for the electro-absorption Q-modulator and constitutes the rear reflector of the laser. In the past few years, significant progress has been made in dry-etching technologies for fabricating deep, vertical and smooth etched facets. As an example, excellent results on the etched facet quality in InP based material system were reported by J.-J. He, B. Lamontagne, A. Delage, L. Erickson, M. Davies, and E. S. Koteles, in a paper entitled "Monolithic integrated wavelength demultiplexer based on a waveguide Rowland circle grating in InGaAsP/InP", J. Lightwave Tech. Vol. 16, pp. 631-638, 1998. One of the applications for high-quality etched facets is waveguide based echelle grating devices, which has been commercially developed. The maturity of manufacturing technology for vertical and smooth etched facets and air gaps has provided the basis in terms of technological feasibility for the devices of the present invention.

Figure 4:
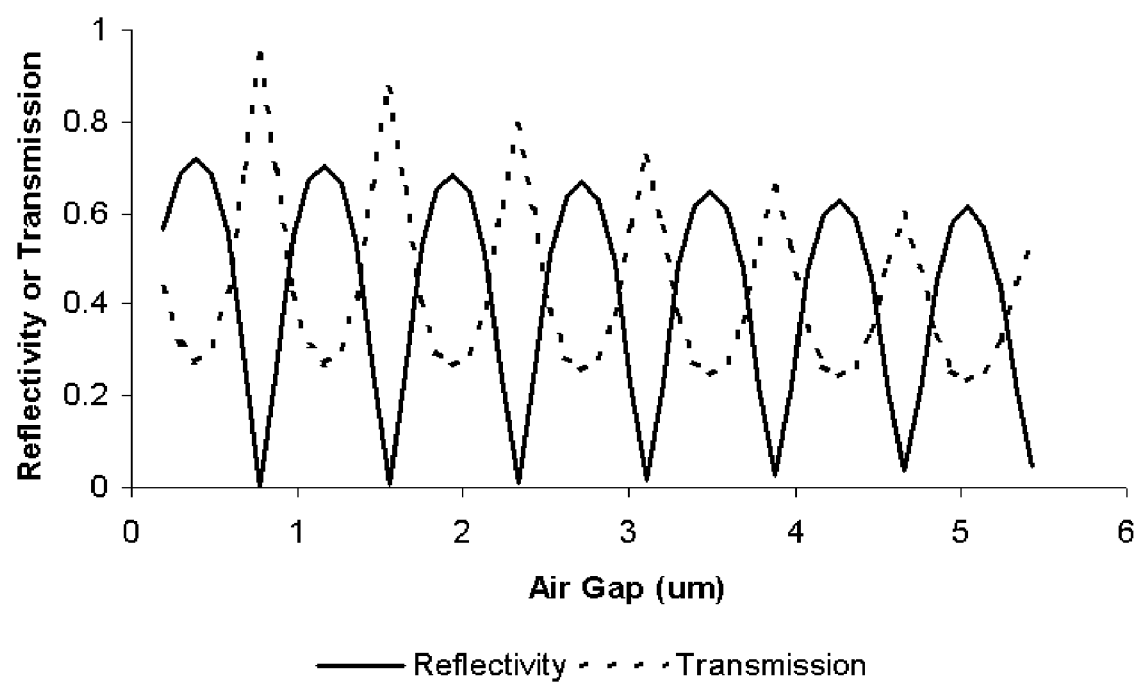
FIG. 4 is the reflectivity and transmission coefficients of an air gap as a function of the gap size at 1550 nm wavelength.

The air gaps in the device structure act as reflecting mirrors. A high reflectivity is achieved when the gap size is substantially equal to an odd-integer multiple of a quarter wavelength, i.e., $\lambda/4$, $3\lambda/4$, $5\lambda/4$, ... etc. FIG. 4 shows the reflectivity and transmission coefficient of the air gap as a function of the gap size at 1550 nm wavelength. If the gap size is equal to an even-integer multiple of a quarter wavelength (i.e. λ/2, λ, 3λ/2, . . . etc), the reflectivity of the air trench becomes almost negligible.

Theoretically, the best performance is obtained with the smallest air gap, i.e., about λ/4. This is because the loss at the unguided air gap increases as the gap size increases, due to beam divergence. Consequently, the peak reflectivity decreases, as can be seen in FIG. 4. Also, the reflectivity becomes more wavelength dependent with an increasing gap size. On the other hand, the fabrication becomes more challenging as the gap size decreases, since a λ/4 gap is only 0.3875 µm for 1550 nm wavelength. A 5λ/4 to 9λ/4 gap, corresponding to a size of 1.94 µm to 3.49 µm, is a good compromise. The error tolerance on the gap is in the order of ±0.1 µm for InP based material system, regardless of the gap size. This is achievable with current state of the art fabrication technology. As the technology advances, one can expect that the achievable gap size will become smaller and smaller. To illustrate the principle of operation of the devices of the present invention, we neglect the loss of air trenches due to beam divergence in the following numerical examples.

The size of the air trench can also be designed to deviate from an odd-integer multiple of a quarter wavelength so that the air trench has an optimum reflectivity. In such a case, there is a non-zero phase change Φ associated with the reflection at the air trench.

In accordance with one embodiment of the present invention, the waveguide segment of the electro-absorptive modulator is placed within an anti-resonant cavity formed by two etched air trenches (or an etched trench and a cleaved facet). An optical cavity is called anti-resonant when it is operated in high reflection (low transmission) mode, with a low energy density inside the cavity. The modulator waveguide and the air trenches form the rear reflector of the laser, whose reflectivity can be changed through an electro-absorption effect. Here the electro-absorption effect refers generally to a change of absorption coefficient of the waveguide by an electrical means, either a reverse biased voltage or a current injection. The optical path length of the modulator waveguide is designed to be close to the following anti-resonant condition, $$\frac{4\pi n}{\lambda}L + 2\Phi = (2m+1)\pi \quad (1)$$

where L is the length of the modulator waveguide, n its effective refractive index, λ the wavelength in vacuum, Φ the phase of the air trench reflectivity, and m an integer.

As a numerical example, we consider λ=1550 nm, n=3.215, and m=50. The size of the air gap is chosen to be 1.15λ=1.7825 µm. The calculated reflectivity of the air gap is 0.58 and its phase is −0.3943. From Eq. (1), the modulator length is calculated to be L=12.2 µm. FIG. 5 (a) shows two reflectivity spectra of the rear reflector when the absorption coefficient of the modulator waveguide is α=0 and α=2000 cm$^{-1}$, corresponding to a normalized absorption coefficient of αL=0 and αL=2.4, respectively. FIG. 5(b) shows the corresponding reflection phase change. The two curves corresponding to the two different modulator absorption values cross at λ=1550.5 nm. We can see that around λ=1550.5 nm, the reflectivity changes significantly with the modulator absorption, while the associated phase change is negligible. As we will show later, this reflectivity change results in a change in the Q-factor of the laser cavity, and consequently the lasing threshold.

In principle, instead of the anti-resonant condition, the modulator can also be operated in a resonant condition, i.e., $$\frac{4\pi n}{\lambda}L + 2\Phi = 2m\pi \quad (2)$$

Figure 5A:
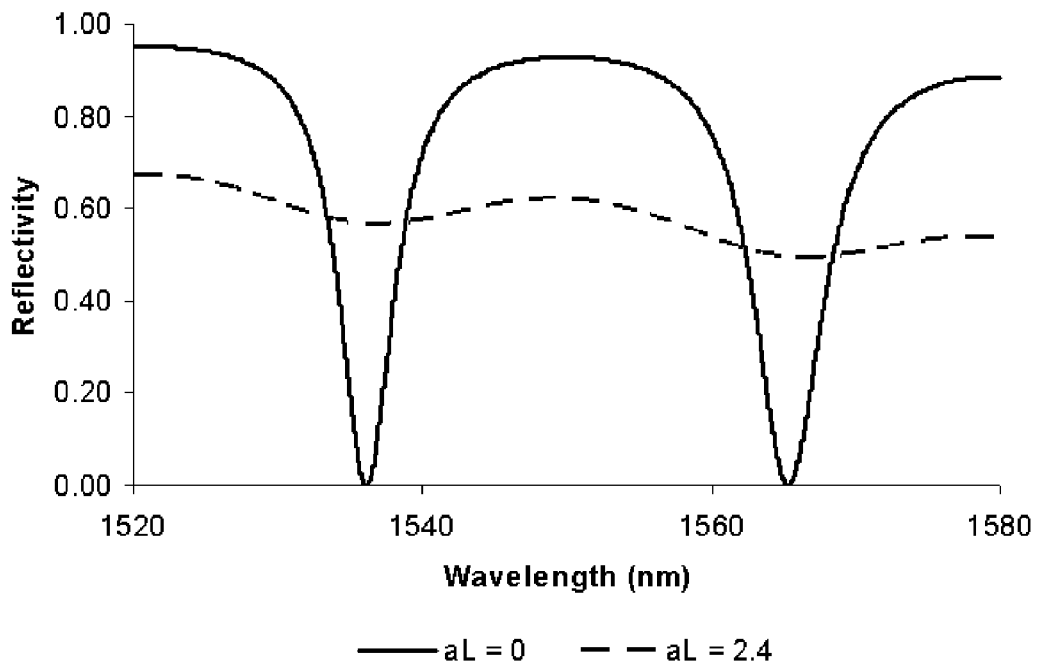
FIG. 5 is the reflectivity spectra (a) and reflection phase change (b) of the rear reflector consisting of a modulator waveguide bounded by two etched air trenches for two different normalized absorption coefficients $\alpha L=0$ and $\alpha L=2.4$.
Figure 5B:
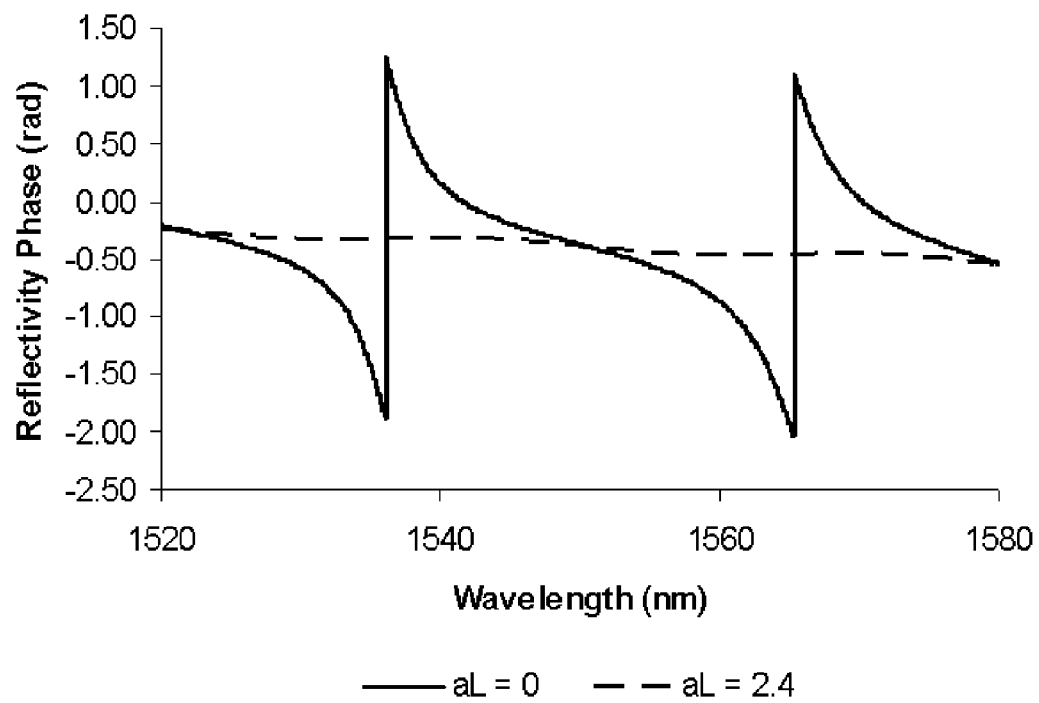

This corresponds to the reflectivity minima in FIG. 5(a), i.e., λ=1536.1 nm or λ=1565.3 nm. Under this condition, the reflectivity can also be changed significantly by the modulator absorption (in opposite direction to the anti-resonant case). However, the associated phase change is also significant, as can be seen in FIG. 5(b). This will degrade the chirp characteristics of the laser. Besides, the wavelength dependence is much stronger at the resonance condition, resulting in a narrow operating wavelength range and low fabrication tolerance.

Figure 6:
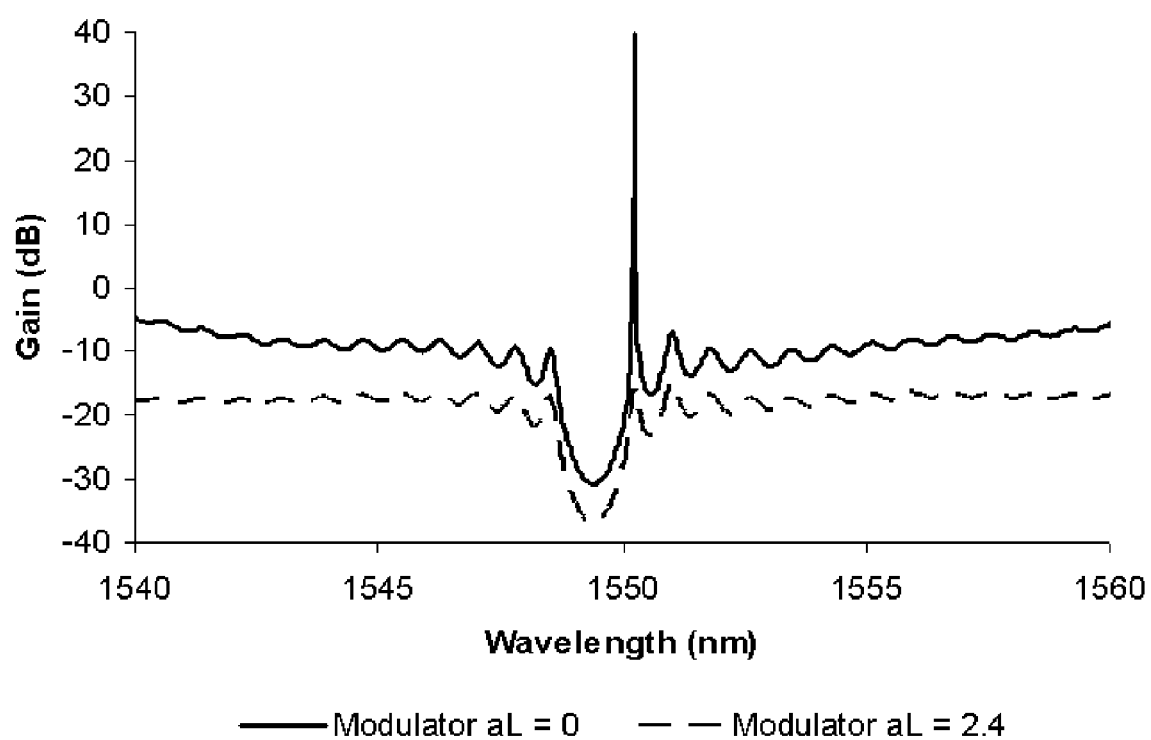
FIG. 6 is the small signal gain spectra of the laser structure for two different modulator states corresponding to normalized absorption coefficients $\alpha L=0$ and $\alpha L=2.4$.

FIG. 6 shows the small signal gain spectra of the complete laser structure of FIG. 3. The DFB section has a length of 400 µm. It is assumed that the grating has a rectangular effective index profile with $n_1$=3.215, $n_2$=3.21 (Δn=0.005), and a period Λ=0.2412 µm. The normalized coupling coefficient is calculated by $$\kappa L_a = \frac{2(n_1 - n_2)L_a}{(n_1 + n_2)\Lambda} = 2.6$$

It is further assumed that the grating is partially gain-coupled, with the gain produced solely in the high-index segments. An example of partially gain coupled DFB lasers is described by G. P. Li, T. Makino, and H. Lu, "Simulation and interpretation of longitudinal-mode behavior in partly gain-coupled InGaAsP/InP multiquantum-well DFB lasers", IEEE Photonics Technology Letters, vol. 4, no. 4, pp. 386~388, 1993. In our numerical example, the length of the phase section is set to $L_p$=50.2 µm. The two spectra of FIG. 6 are calculated at a gain coefficient of g=9.1 cm$^{-1}$ for normalized modulator absorption coefficient αL=0 and αL=2.4, respectively.

Due to the fact that the optical gain is produced in the high index segments of the grating, the DFB mode at the long wavelength side of the stop-band has the lowest threshold. When the modulator is at the transparent state (α=0), the threshold gain coefficient of the main mode (λ=1550.25 nm) at the long wavelength side of the stop band is 9.1 cm$^{-1}$, while the threshold of the first mode (λ=1548.51 nm) at the short wavelength side is 65 cm$^{-1}$. Such a large threshold difference ensures that the laser is single mode with a high side-mode suppression ratio. When the modulator is at the absorptive state with αL=2.4, the threshold gain coefficients of the two modes are increased to 37.6 cm$^{-1}$ and 71.3 cm$^{-1}$, respectively, while their lasing wavelengths remain the same. The large threshold difference between the two modulator states (9.1 cm$^{-1}$ and 37.6 cm$^{-1}$) for the main mode reflects the effective Q-switching caused by the modulator. When the laser section is pumped by a constant current producing an optical gain that is below the threshold of the absorptive modulator state but well above the threshold of the transparent (or low absorption) state, the laser output will be modulated by the signal applied on the modulator. The negligible phase change associated with the Q-modulation resulting in a low wavelength chirp is a significant advantage of the device of the present invention.

Figure 7A:
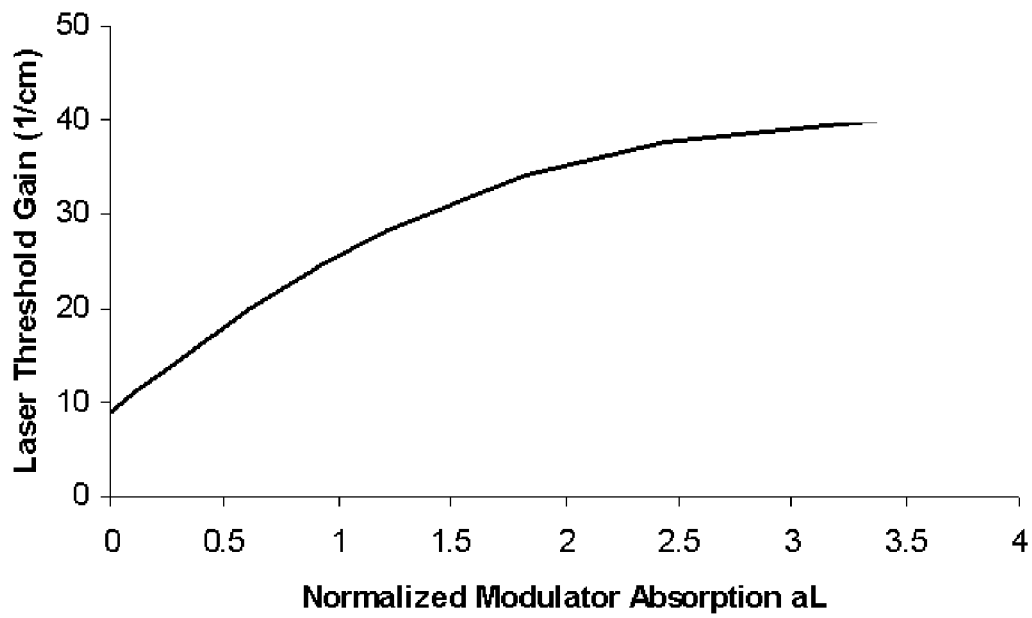
FIG. 7 is the laser threshold gain coefficient (a) and wavelength variation (b) as a function of the normalized modulator absorption $\alpha L$.
Figure 7B:
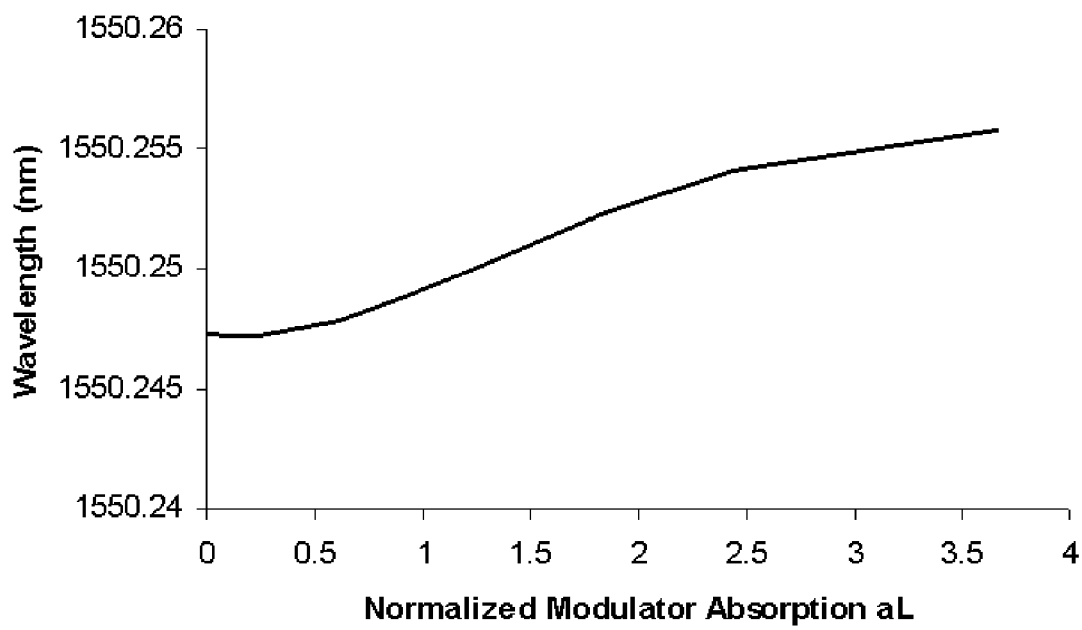

FIG. 7(a) shows the laser threshold gain coefficient as a function of the modulator absorption. We can see that a threshold difference of 100% can be obtained with a modulator absorption coefficient of only 500 cm$^{-1}$ (corresponding to αL=0.6). If the optical path length of the modulator is designed so that the laser wavelength is at the cross-point (i.e. λ=1550.5 nm) of the two curves in FIG. 5(b), the shift of the lasing wavelength of the combined structure with the modulator absorption value will be negligible. The shift increases when the laser wavelength is away from this optimal operating point. However, the amount of the shift is still several orders of magnitude smaller than that in a directly modulated laser. FIG. 7(b) shows the wavelength variation as a function of the modulator absorption for the example structure. The lasing wavelength is at λ=1550.25 nm, 0.25 nm away from the optimal operating point. When the normalized modulator absorption αL varies from 0 to 2.4, the threshold changes by more than 4 times (from 9.1 cm$^{-1}$ to 37.6 cm$^{-1}$) while the wavelength variation is less than 0.007 nm. This compares to a wavelength chirp in the order of 1 nm in a conventional directly modulated DFB laser.

Figure 8:
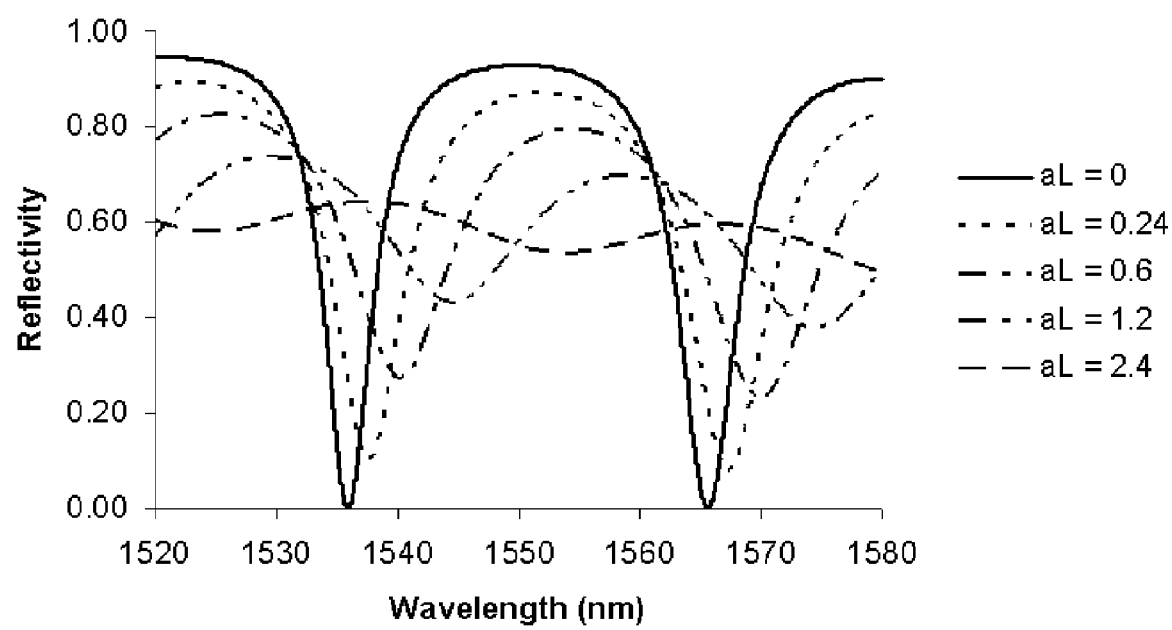
FIG. 8 is the reflectivity spectra of the rear reflector for different modulator absorption values, assuming that the ratio between the real and imaginary parts of the effective refractive index change of the modulator waveguide is 1.5.

In semiconductor materials, the absorption change is accompanied by a refractive index change through the Kramer-Kronig relationship, which may be significant under certain operating regimes. By appropriately choosing the operating parameters of the modulator cavity near its anti-resonant condition, this refractive index change can be used to enhance the laser threshold modulation. FIG. 8 shows the reflectivity spectra of the rear reflector for different modulator absorption values of αL=0, αL=0.24, αL=0.6, αL=1.2 and αL=2.4. It is assumed that the ratio between the real and imaginary parts of the effective refractive index change of the modulator waveguide is 1.5. We can see that at the operating wavelength of around 1550 nm, the shift of the spectra due to the refractive index change further decreases the reflectivity as the absorption value increases.

The operating condition of the modulator cavity can be generally described by a fractional parameter f(0≦f<1), which is defined by the following equation when the modulator absorption is zero (the transparent state)

$$\frac{4\pi n}{\lambda}L + 2\Phi = 2(m+f)\pi \quad (3)$$

Figure 9A:
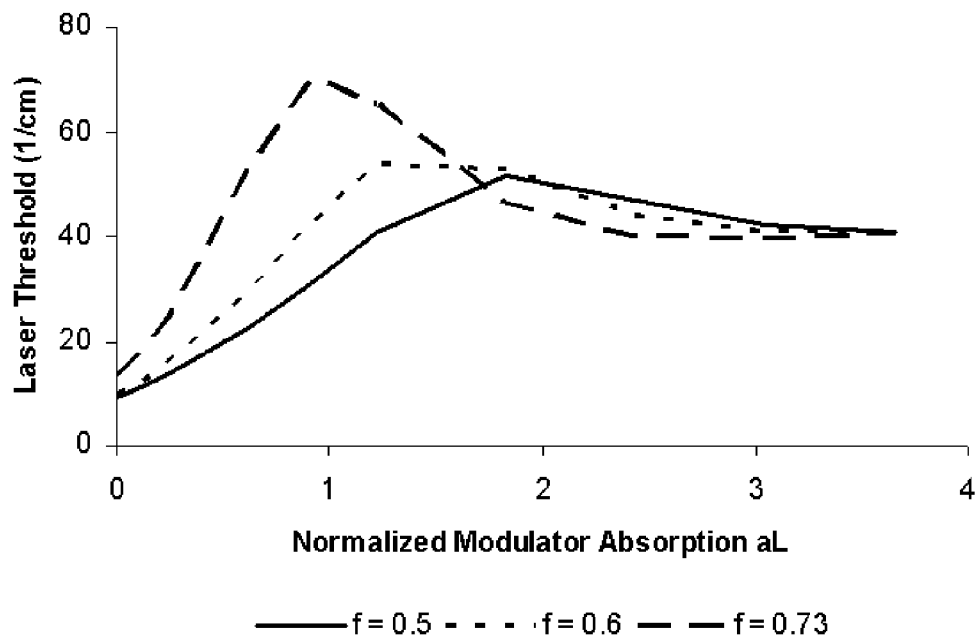
FIG. 9 is the laser threshold gain coefficient (a) and wavelength variation (b) as a function of the normalized modulator absorption, at different operating points of the modulator cavity.
Figure 9B:
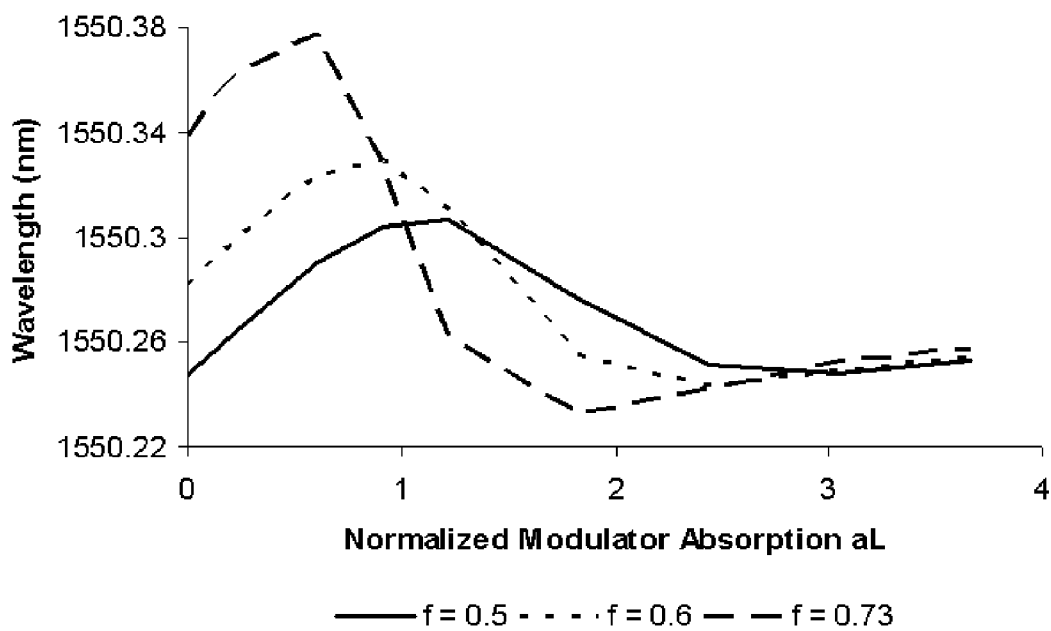

FIG. 9 shows the laser threshold gain coefficient (a) and the corresponding wavelength variation (b) as a function of the modulator absorption, for the cases f=0.5 (corresponding to the exact anti-resonant condition), f=0.6 and f=0.73. We can see that the slope of the threshold variation is larger compared to that of FIG. 7(a), indicating the constructive contribution from the refractive index change. When the f parameter increases from 0.5, the required modulator absorption change for a given threshold variation decreases. For f=0.73, for example, a modulator absorption change from 0 to 500 cm$^{-1}$ (corresponding to αL changing from 0 to 0.6) can cause the threshold gain coefficient to change from 12.8 cm$^{-1}$ to 52.3 cm$^{-1}$, a variation of more than four times. The corresponding wavelength variation is only 0.039 nm.

In the above embodiment of the present invention, the optical path length of the phase section is important for the operation of the device. It needs to be adjusted so that the field distribution from the Fabry-Perot resonance mode is constructive with respect to that of the DFB resonance mode. Therefore, to obtain full adjustment range, the length of the phase section needs to be long enough to produce a π-phase shift by changing the applied current or voltage. In practice, the required DC voltage or current can be determined by minimizing the lasing threshold or maximizing the output power, when the modulator is set to the on-state. The DC bias applied on this section can also be used to slightly adjust the operating wavelength of the laser.

In the above embodiment, the DFB grating is only present in the active gain section of the laser, while the phase section and the modulator section have no grating. For conventional DFB lasers, the grating is patterned by holographic exposure method using two-beam interference. The requirement of patterning the grating in selective areas of a wafer would increase the fabrication complexity. However, as shown in the following, the presence of gratings in the phase and modulator sections does not affect the operation of the device. This allows us to simplify the fabrication process by patterning the grating on the whole wafer.

Figure 10:
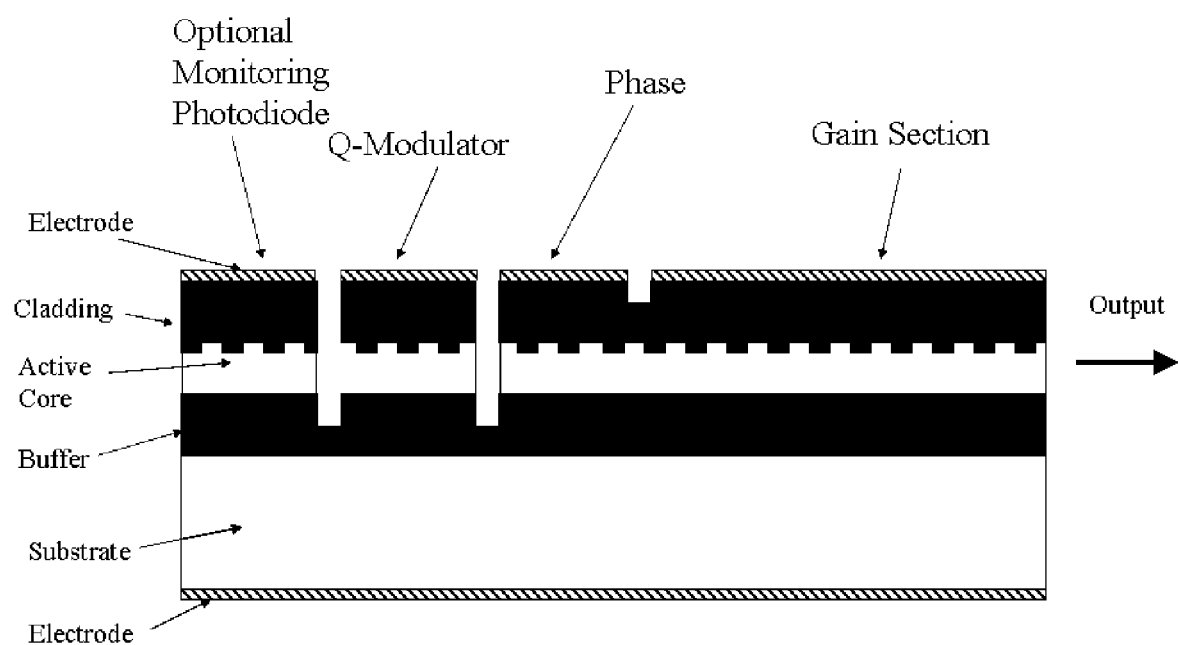
FIG. 10 is a schematic drawing of a Q-modulated semiconductor laser in accordance with another embodiment of the invention where the DFB grating is incorporated throughout the structure.

FIG. 10 shows another embodiment of the present invention. It consists of three sections: gain, phase and modulator. The device is fabricated on a wafer patterned with a uniform DFB grating. Each section has a separate top electrode and a common ground electrode on the back side. The modulator and the phase section are separated by a deeply and vertically etched air trench that cuts through the waveguide core layer, while the gain section and the phase section are connected by a continuous waveguide. The active section is injected with a large current to provide an optical gain to the laser. The phase section is pumped to a substantially transparent regime and the adjustment of its bias current provides a phase control for the optical wave reflected by the air trench and the modulator cavity. The modulator section is subject to an electrical signal that causes the waveguide material property to oscillate between a substantially transparent (or small gain) state and a substantially absorptive state. The other side of the modulator section is terminated by another etched air trench or a cleaved facet. An optional monitoring photodetector is also integrated.

Since the length of the modulator section is relatively short, the effect of the grating corrugation is almost negligible. We have calculated the reflectivity spectra of the rear reflector with the same parameters as those for FIG. 5, except that the modulator waveguide has grating corrugations with a period Λ=0.2412 μm and Δn=0.005. The resulting spectra are almost identical to those of FIG. 5.

Figure 11A:
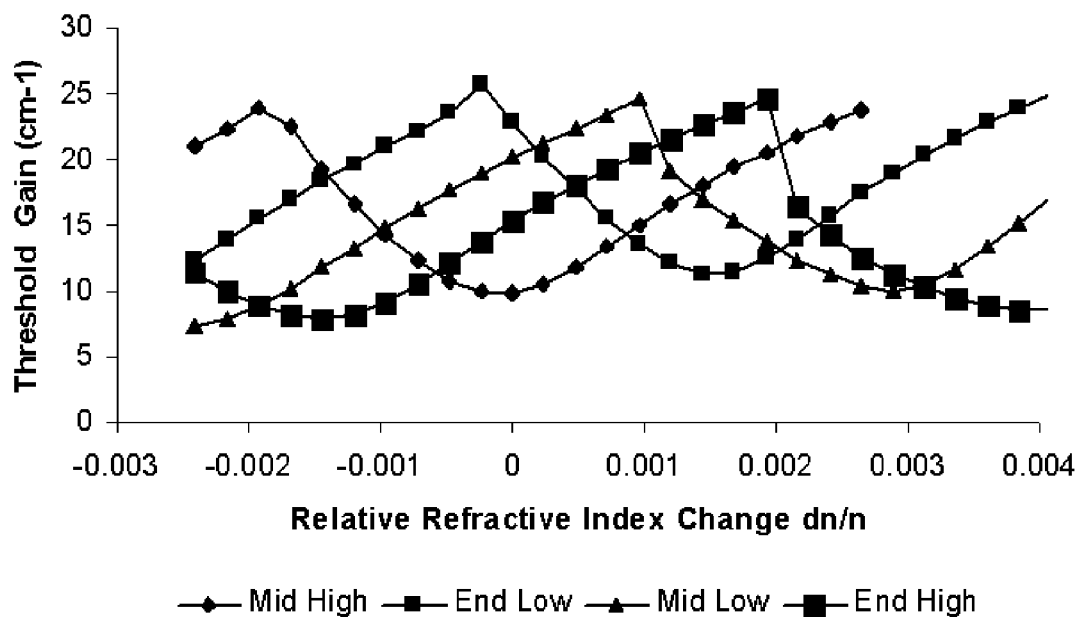
FIG. 11 is the laser threshold gain (a) and wavelength (b) as a function of the refractive index change of the phase section, for cases where the grating is terminated by the air trench at four different positions within a grating period: the middle of the high-index section, the end of the low-index section, the middle of the low-index section, and the end of the high-index section.
Figure 11B:
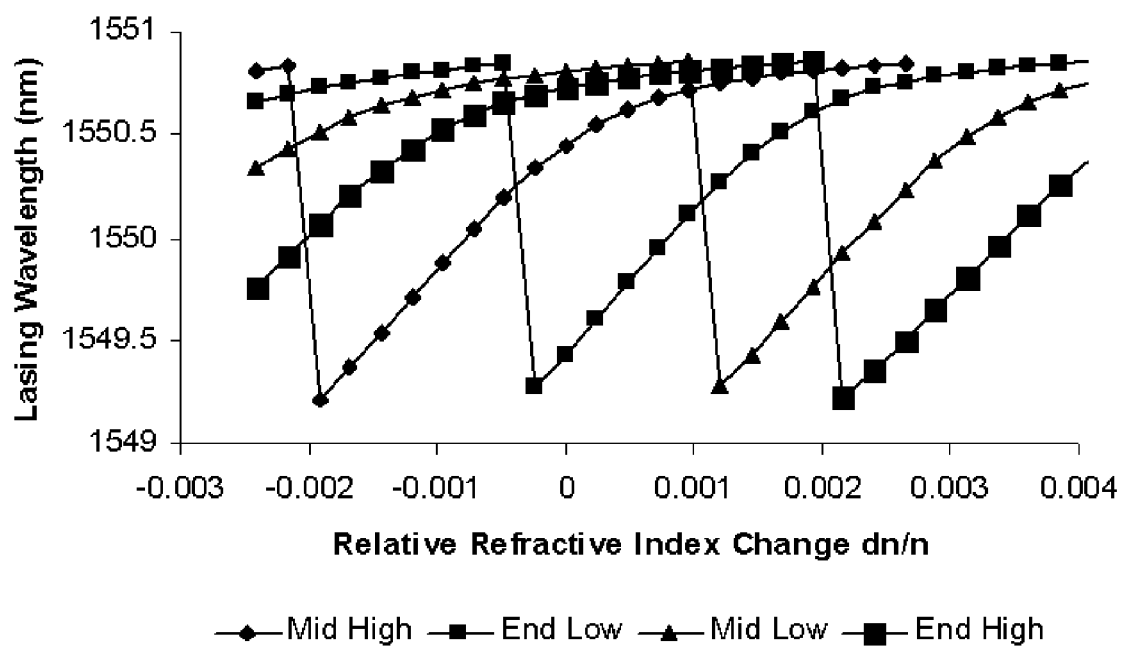

The phase section also works the same way whether or not there is a grating. We consider a laser-modulator structure using the same parameters as in our previous numerical example, except for the presence of the grating corrugations in both the modulator and the phase section. FIG. 11 shows the variation of the laser threshold gain (a) and the lasing wavelength (b) when the refractive index of the phase section changes. The length of the phase section is about $L_p$=50.2 μm. The four curves represent the cases where the grating is terminated by the air trench at four different positions within a grating period: the middle of the high-index section, the end of the low-index section, the middle of the low-index section, and the end of the high-index section. We can see that no matter where the grating terminates, one can adjust the refractive index of the phase section to obtain the lowest lasing threshold of the laser. The lasing wavelength shifts slightly (in the order of 1 nm) when the phase section is adjusted, and a mode-hopping occurs when the threshold reaches a certain high level. When the phase section is adjusted for the lowest threshold, however, the lasing wavelength is essentially independent of the end phase of the grating (~1550.4 nm in this numerical example).

Figure 12:
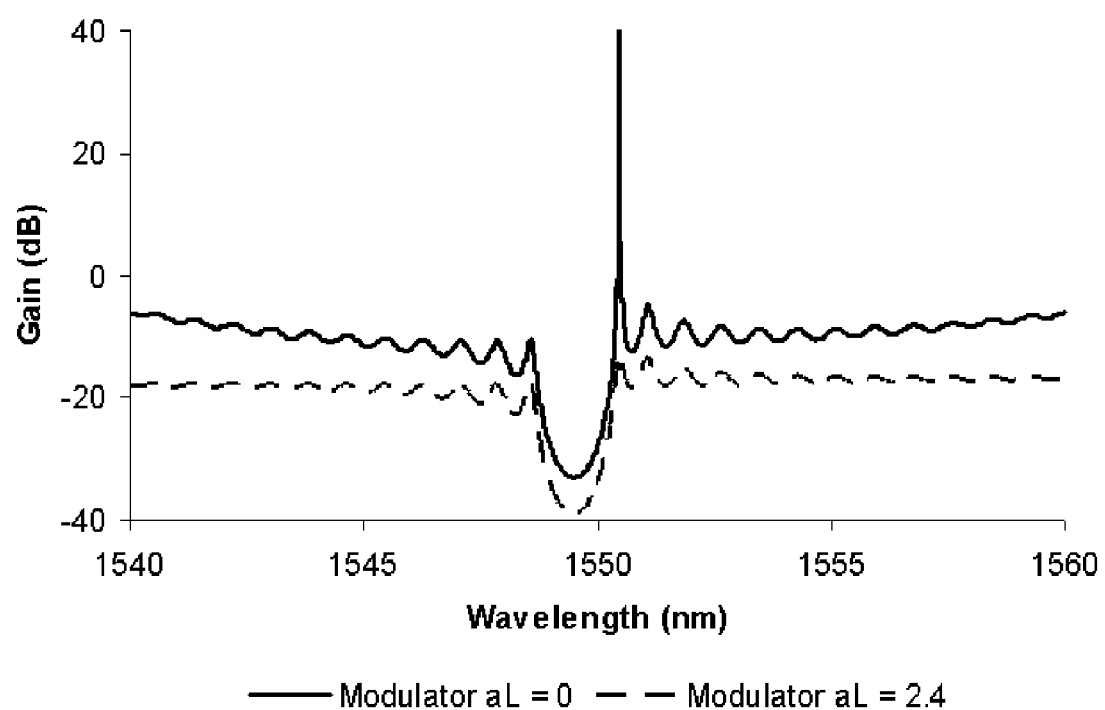
FIG. 12 is the small signal gain spectra of the laser structure with DFB grating incorporated in all three sections for two different modulator states corresponding to normalized absorption coefficients $\alpha L=0$ and $\alpha L=2.4$.

FIG. 12 shows the small signal gain spectra of the laser structure, calculated at a gain coefficient of g=9.8 cm$^{-1}$ for normalized modulator absorption coefficient αL=0 and αL=2.4. We can see that they are almost identical to those of FIG. 6, indicating that the gratings in the modulator and the phase sections do not affect significantly the operation of the device.

Figure 13:
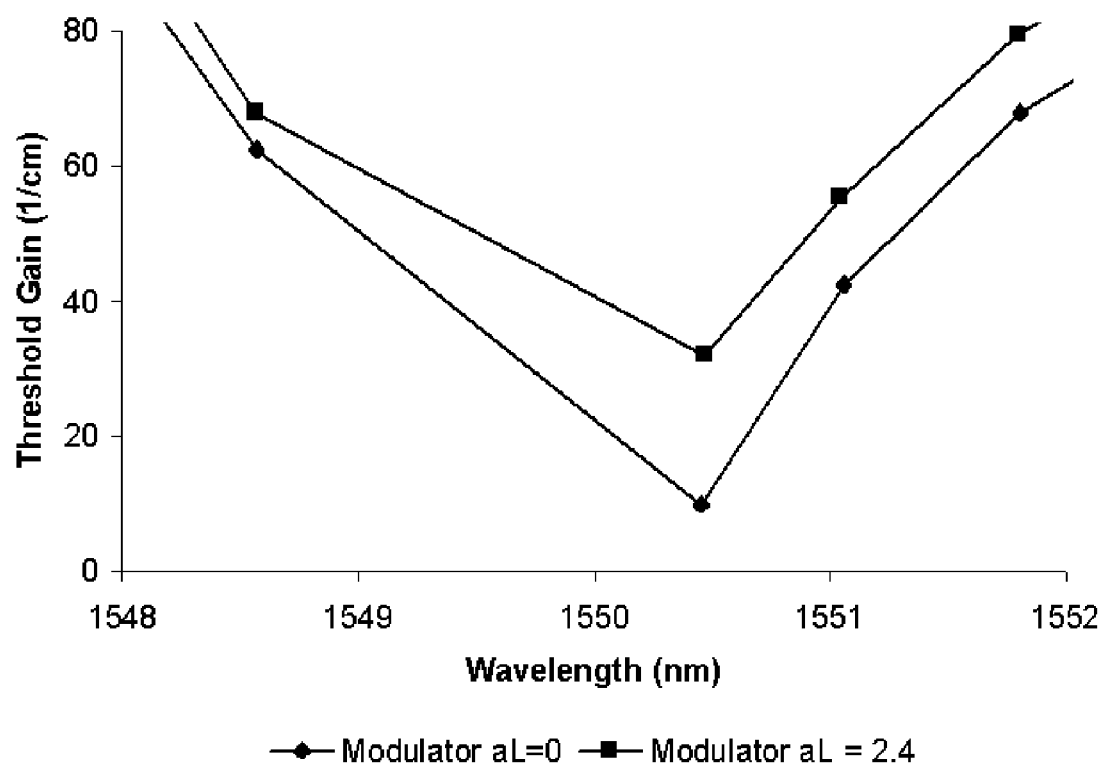
FIG. 13 is the threshold gain of the different modes (indicated by markers) around the main lasing mode at 1550.4 nm, for normalized modulator absorption coefficient $\alpha L=0$ and $\alpha L=2.4$.

In FIG. 13 we plot the threshold gain of the modes around the main lasing mode at 1550.4 nm, for normalized modulator absorption coefficient αL=0 and αL=2.4. The positions of the different modes are indicated by the markers. Due to the partially gain coupled DFB grating, a large threshold discrimination is achieved which ensures the dynamic single-mode operation of the laser. The change of the modulator absorption causes the threshold of the main mode to increase from 9.8 cm$^{-1}$ to 32 cm$^{-1}$, showing the effective Q-switching of the modulation mechanism.

It is obvious to one skilled in the art that the phase section in both of the above two embodiments can be omitted if the position of the air trench can be controlled precisely with respect to the DFB grating corrugations. On the other hand, a phase section can be added in the anti-resonant modulator cavity to adjust the operating point of the Q-modulator. It is also possible to replace the DFB and phase sections with a multi-section DFB with three or more electrodes to increase the wavelength tunability of the laser.

Figure 14A:
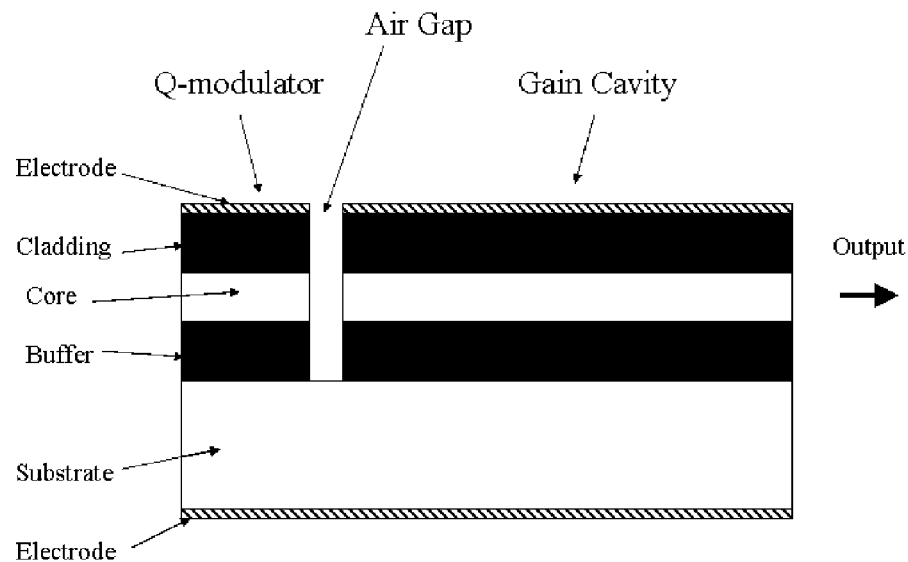
FIG. 14 is a schematic drawing of a Q-modulated semiconductor laser in accordance with another embodiment of the invention where the laser is a simple Fabry-Perot laser (a) or a Fabry-Perot laser with an additional mode-selecting filter fabricated with deep etched trenches (b).
Figure 14B:
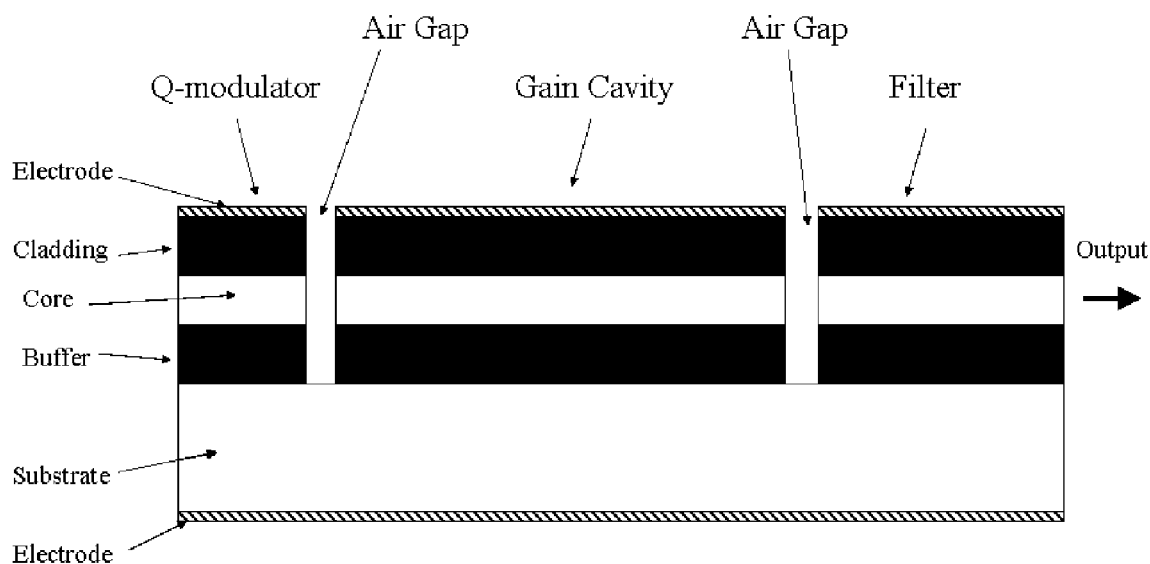

The Q-modulator of the present invention can also be integrated with a Fabry-Perot laser, as shown in FIG. 14(a). Furthermore, an optical filter based on one or more Fabry-Perot cavities can be integrated to make the laser single mode, as shown in FIG. 14(b). The different sections of the laser are separated by deeply etched trenches, without a need for a DFB grating. Such a device is very simple to fabricate and has a performance much better than a directly modulated Fabry-Perot laser in terms of wavelength stability and modulation speed. Potentially it can find wide applications in metro and access networks where low cost components are of paramount importance.

Figure 15:
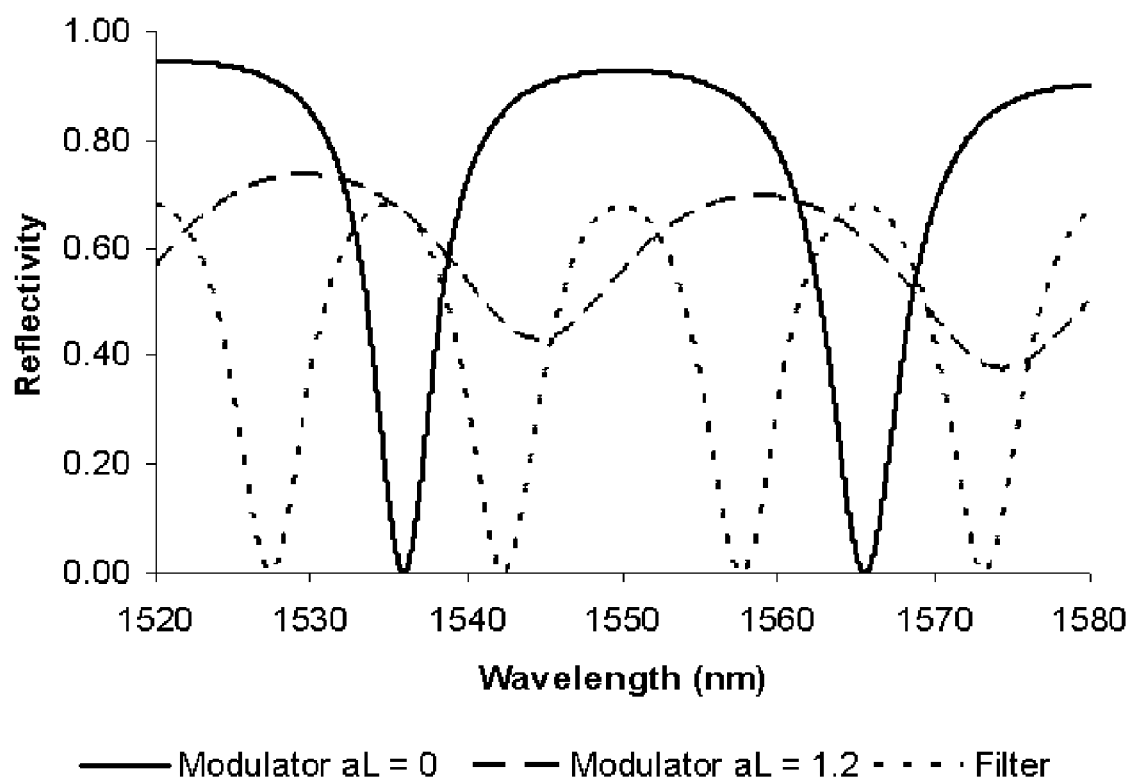
FIG. 15 is the reflectivity spectra of the filter and the rear reflector with the modulator at on ($\alpha L=0$) and off ($\alpha L=1.2$) states.
Figure 16:
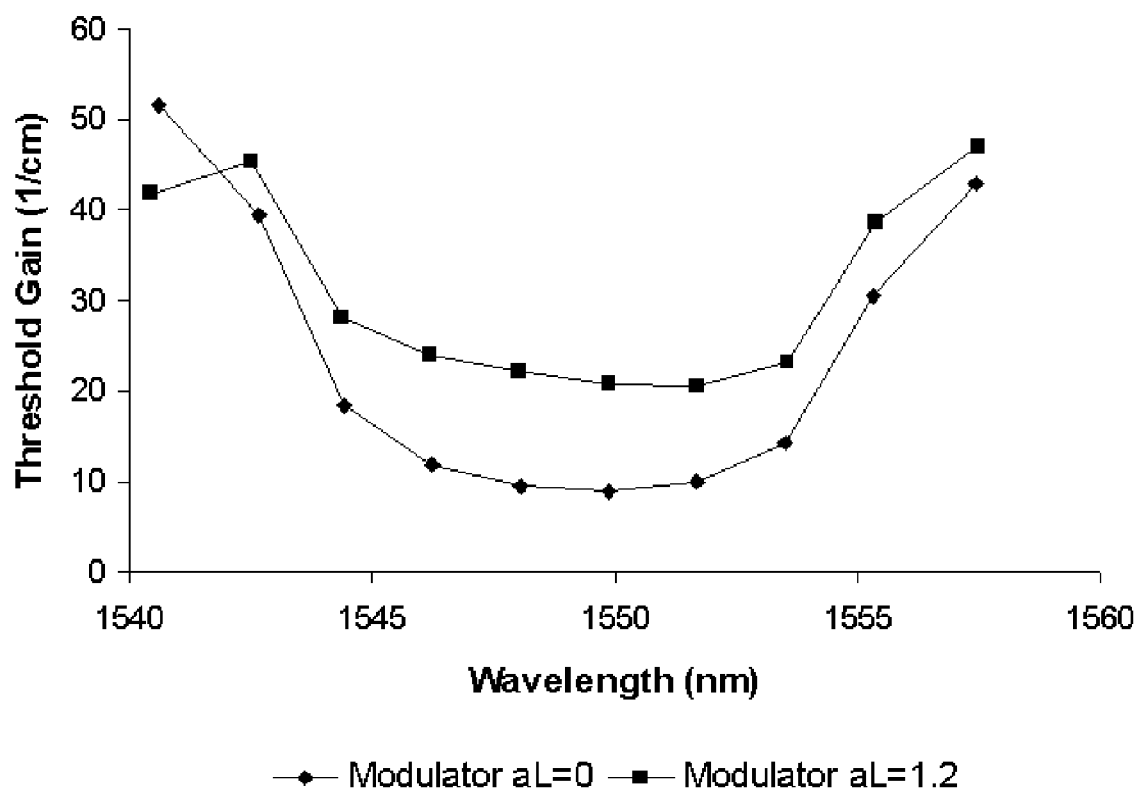
FIG. 16 is the lasing thresholds for different longitudinal modes around the designed central wavelength of 1550 nm for both the on ($\alpha L=0$) and off ($\alpha L=1.2$) modulator states.

Note that a Fabry-Perot laser cavity is always operated under resonant condition for the lasing wavelength, corresponding to high energy density inside the cavity, while the modulator and filter cavities are preferably close to the anti-resonant condition. As a numerical example, we consider waveguide lengths of 12.2 μm, 200 μm, and 24.5 μm for the modulator, active laser and the filter sections, respectively. The air trenches are 1.78 μm. FIG. 15 shows the reflectivity spectrum of the filter, as well as those of the modulator (as seen from inside of the laser cavity) at on (αL=0) and off (αL=1.2) states. The product of the filter and modulator reflectivity spectra determines the filtering function for selecting the lasing mode. The mode of the active cavity near the peak of this spectral function, which is designed to be substantially coincident with the peak of the material gain spectrum, will have the lowest lasing threshold. FIG. 16 shows the corresponding lasing thresholds for different longitudinal modes around the designed central wavelength of 1550 nm for both the on and off modulator states. The spectral gain distribution of the active waveguide material is not considered in the above calculations, which would increase further the mode selectivity. The lowest threshold increases from 8.8 cm$^{-1}$ to 21 cm$^{-1}$ when the modulator switches from the on state to the off state.

Figure 17:
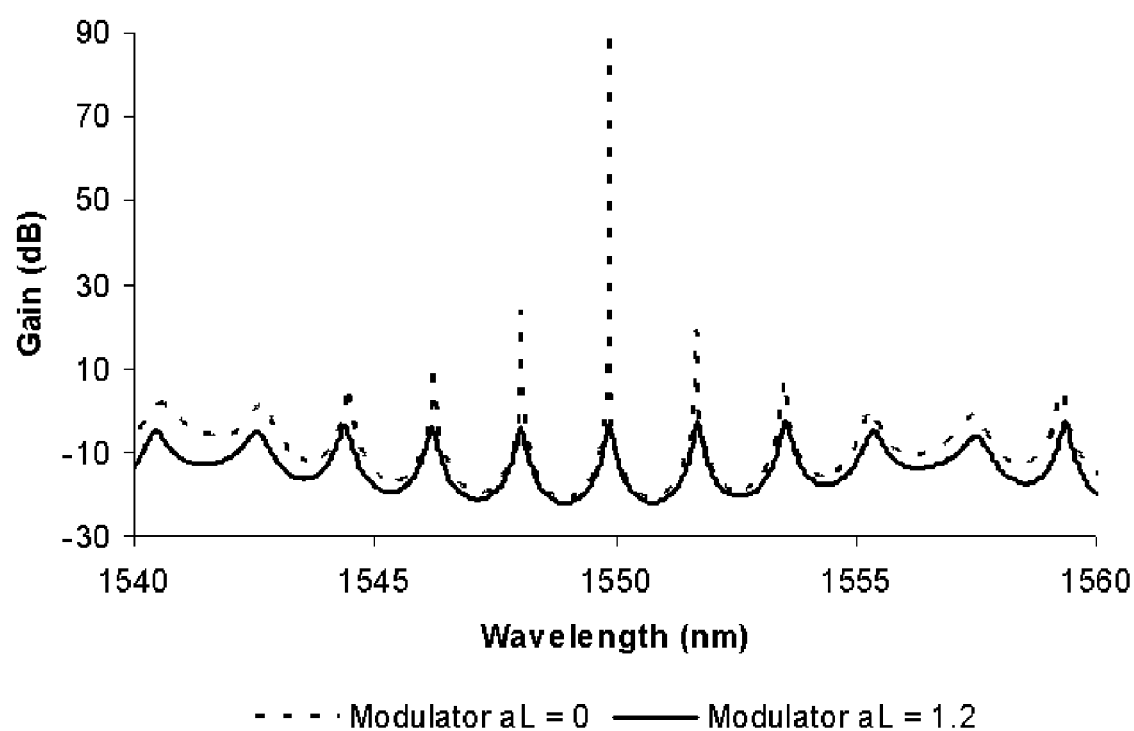
FIG. 17 is the small signal gain spectra of the laser structure of FIG. 12(b) for normalized modulator absorption coefficient $\alpha L=0$ and $\alpha L=1.2$.
Figure 18A:
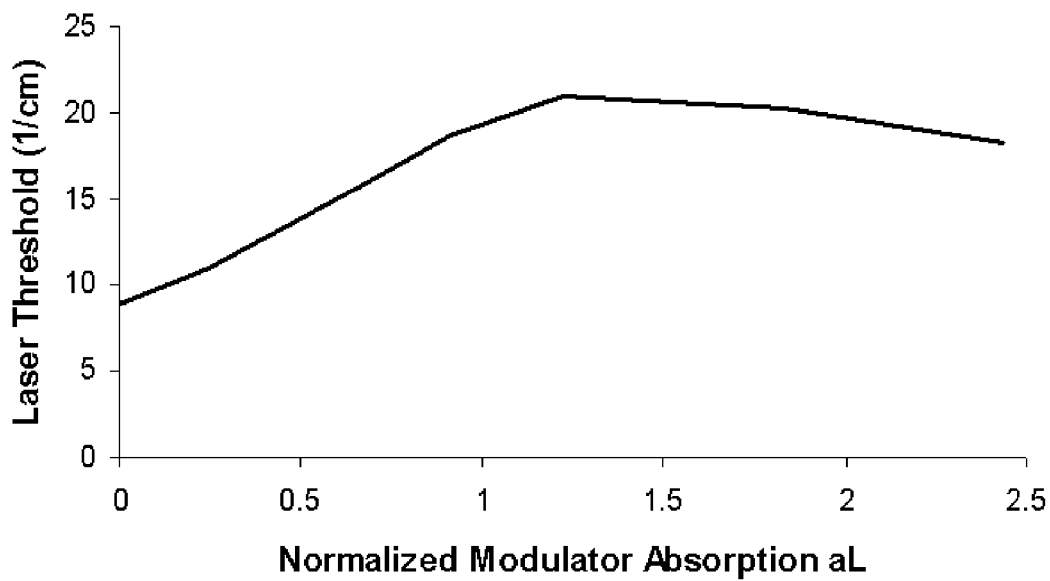
FIG. 18 is the laser threshold gain coefficient (a) and wavelength variation (b) as a function of the normalized modulator absorption.
Figure 18B:
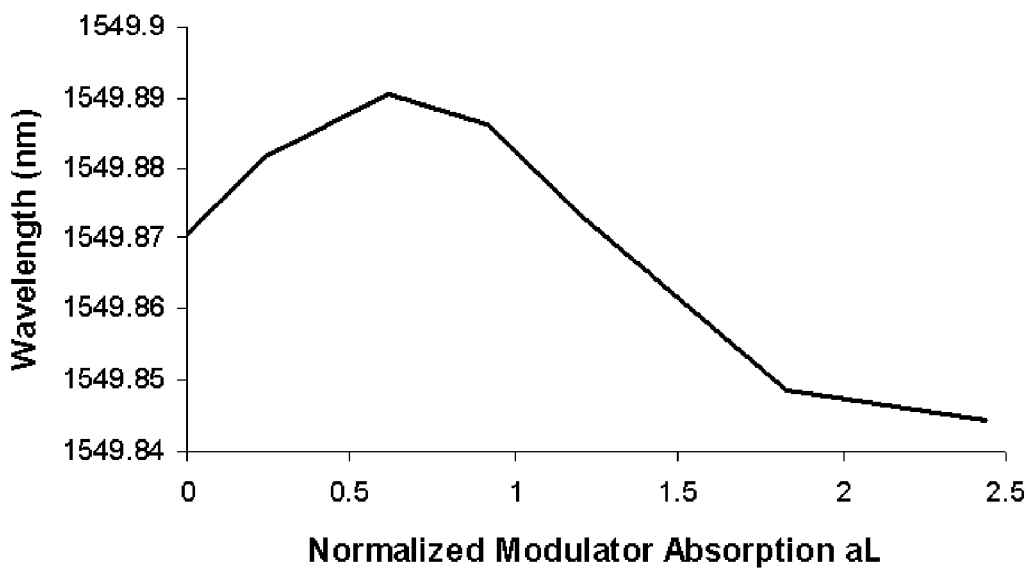

FIG. 17 shows the small signal gain spectra of the complete laser structure of FIG. 14(b), calculated at a gain coefficient of g=8.8 cm$^{-1}$ for normalized modulator absorption coefficient αL=0 and αL=1.2, respectively. Single mode operation is obtained with very little wavelength shift when the laser is modulated. FIG. 18 shows the laser threshold gain coefficient (a) and the corresponding wavelength variation (b) as a function of the modulator absorption. When the normalized modulator absorption coefficient αL varies from 0 to 1.2, the threshold changes from 8.8 cm$^{-1}$ to 21 cm$^{-1}$ while the wavelength variation is less than 0.02 nm.

Figure 19A:
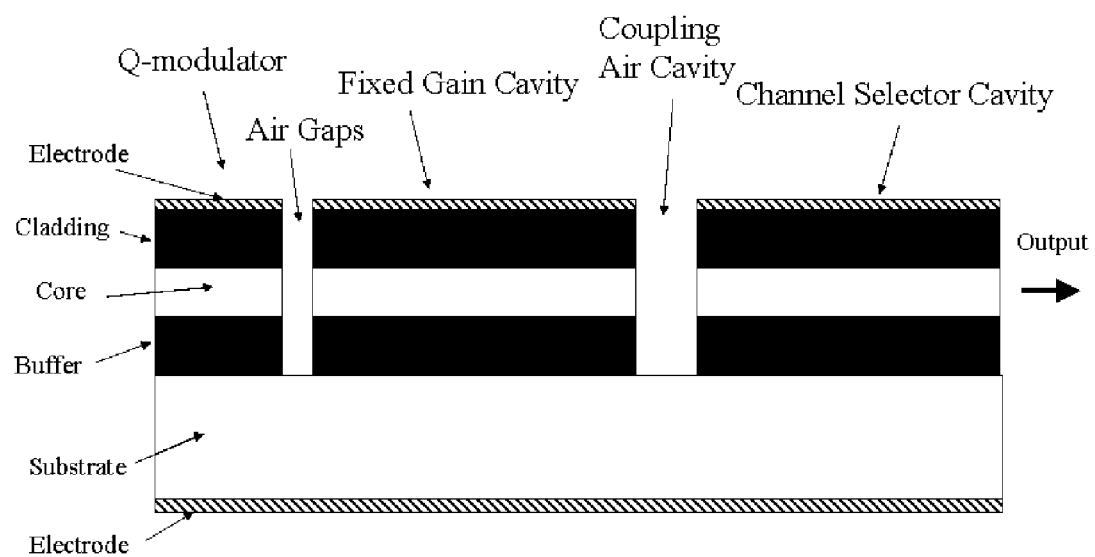
FIG. 19 is a schematic drawing of a Q-modulated semiconductor laser in accordance with another embodiment of the invention where the laser is a multi-cavity wavelength-switchable laser with a coupling air cavity (a) or a coupling waveguide cavity (b).
Figure 19B:
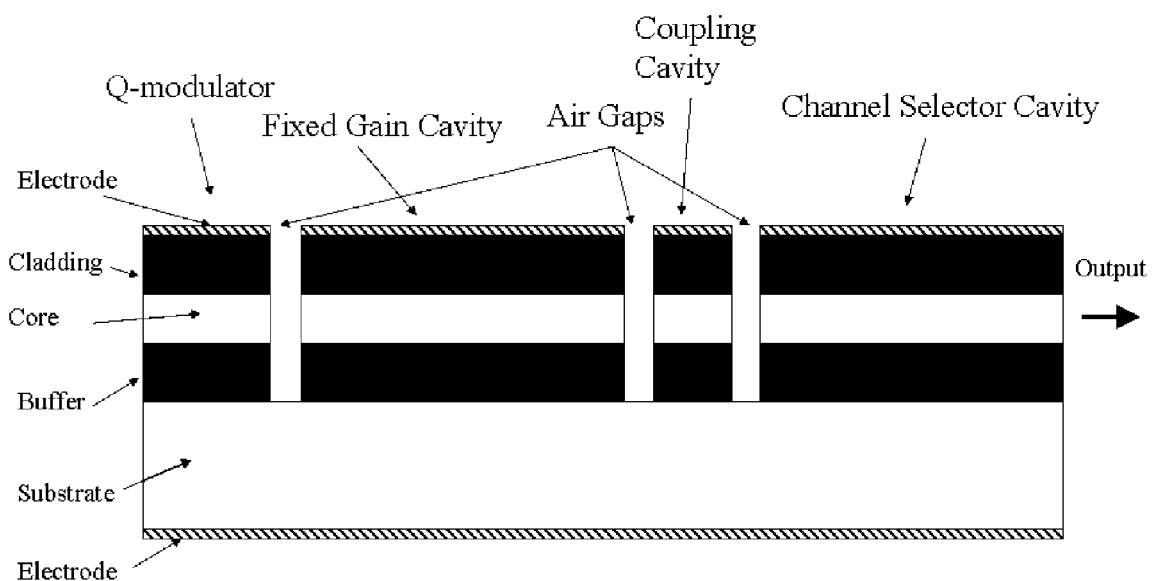

The Q-modulator of the present invention can also be integrated with a wavelength switchable laser based on multiple Fabry-Perot cavities, as described in U.S. patent application Ser. No. 10/908,362, entitled "Wavelength switchable semiconductor laser" by J.-J. He. FIG. 19a shows another embodiment of the present invention. It consists of a Q-modulator cavity (substantially anti-resonant), a fixed gain cavity (resonant), and a channel selector cavity (resonant). The Q-modulator cavity and the fixed gain cavity are separated by a partially reflecting etched air gap, preferable of a size substantially equal to an odd multiple of a quarter wavelength. The channel selector cavity is coupled to the fixed gain cavity through a lossy air cavity whose size is substantially a multiple of a half wavelength. The Q-modulator cavity is anti-resonant as described in previous embodiments, while the fixed gain cavity and the channel selector cavity are resonant and electrically pumped to produce optical gain for the laser. The length and consequently the free spectral range of the fixed gain cavity are designed such that the resonant peaks correspond substantially to a set of discrete operating wavelengths separated by a constant channel spacing. The channel selector cavity has a slightly different length so that only one resonant peak coincides with one of the resonant peaks of the fixed gain cavity over the spectral gain window of the active waveguide material. The lasing action occurs at the common resonant wavelength. These two cavities are coupled through a short coupling air cavity that produces a coupling loss and constructive phase relationship. In operation, the fixed gain cavity is injected with an essentially fixed current, while the current injected in the channel selector cavity is varied in order to switch the laser wavelength to a selectable channel among the set of discrete wavelengths as determined by the fixed gain cavity. As an alternative embodiment, a coupling waveguide cavity is used instead of the coupling air cavity, as shown in FIG. 19b. Etched trenches of a size substantially equal to an odd multiple of a quarter wavelength are used to separate the adjacent cavities. The optical path length of the coupling cavity is substantially equal to a multiple of a half wavelength, so that the fixed gain cavity and the channel selector cavity are in phase at the resonance conditions. The waveguide of the coupling cavity is generally absorptive to improve single-mode characteristics. It can be optionally reverse-biased to provide an adjustable loss in order to obtain optimal mode selectivity for the wavelength switchable laser.

Figure 20:
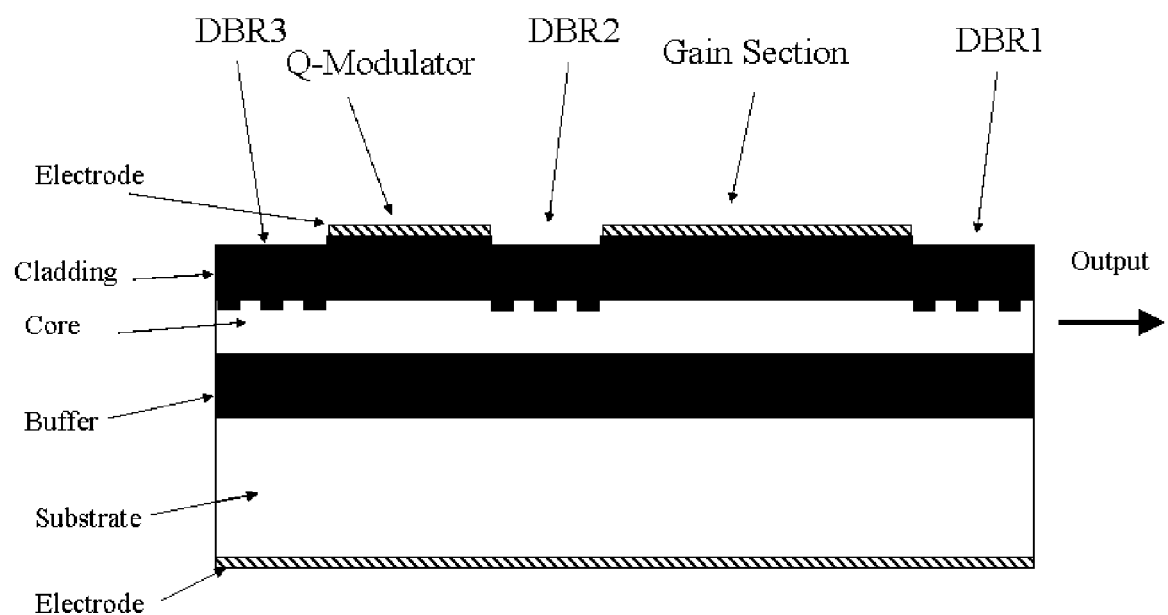
FIG. 20 is a schematic drawing of a Q-modulated semiconductor laser in accordance with another embodiment of the invention where the laser is a distributed Bragg reflector (DBR) laser.

The Q-modulation of the present invention can also be applied to Distributed Bragg Reflector (DBR) lasers. FIG. 20 shows another embodiment of the present invention. The rear reflector of a conventional DBR laser is divided into two sections (DBR2 and DBR3). The Q-modulator is then inserted in between. The length of the Q-modulator waveguide is designed so that the Q-modulator cavity is anti-resonant, satisfying Eq. (1). The DBR gratings provide a good wavelength selectivity for the laser. The waveguide material for the DBR grating sections is preferably transparent. It is made different than the gain and modulator sections by using the etch-and-regrowth technique or a post-growth bandgap engineering method such as quantum well intermixing. The change of the absorption coefficient in the Q-modulator waveguide results in the change in the reflectivity of the combined gratings DBR2 and DBR3, thus leading to the modulation of the threshold and output power of the laser.

The advantages of the devices of the present invention are numerous. Due to the fact that the modulation is done separately from the active laser region, the latter is pumped by a constant current. This not only reduces the wavelength chirp, but also increases the modulation speed due to a much shorter length and consequently much smaller capacitance of the modulator compared to the active laser section or to an external electro-absorption modulator. Compared to an electro-absorption modulator placed in the path of the output laser beam, the extinction ratio of the present device is much higher due to its Q-switching mechanism, without needing a long modulator length. In addition, it does not cause an inherent power loss as in the case of an external electro-absorptive modulator. In the case of the Q-modulator integrated with a Fabry-Perot laser or wavelength switchable multi-cavity laser, the small phase change associated with the modulation resulted in a much better wavelength stability, a reduced mode-hopping and consequently reduced relative intensity noise.

It should be pointed out that the modulation mechanism of the devices of the present invention is to introduce loss in a substantially anti-resonant cavity structure constituting the rear reflector of a semiconductor laser. While we used primarily the electro-absorption or current injection as the loss-varying mechanism, other prior-art techniques for making variable optical attenuators and switches can be equally applied, without departing from the spirit and scope of the present invention.

Numerous other embodiments can also be envisaged. For example, the single air gap separating the cavities can be replaced by multiple air gaps. The gaps can be filled with a material of intermediate refractive index such as silicon oxide or silicon nitride.

What is claimed is:

1. A Q-modulated semiconductor laser comprising:
   a first resonant optical cavity containing a first partially reflecting element at the front end of the laser from which the output power emits, a second partially reflecting element, and a first optical waveguide segment placed between said first and second partially reflecting elements, said first optical waveguide segment being sandwiched between a pair of electrodes for injecting current to provide optical gain,
   a second substantially anti-resonant optical cavity acting as a high-reflection mirror at the rear end of the laser, said second substantially anti-resonant optical cavity having an optical length such that its round-trip phase is substantially equal to an odd-integer multiple of $\pi$ and comprising (1) a second optical waveguide segment having a variable optical loss, (2) the second partially reflecting element coupling the first end of the second optical waveguide segment to the first optical waveguide segment, and (3) a third partially reflecting element at the second end of the second optical waveguide segment,
   said second optical waveguide segment being sandwiched between a pair of electrodes for providing an electrical signal to change the optical loss of said second optical waveguide segment, and consequently to change the Q-factor of the first resonant optical cavity, and hence to modulate the threshold and the output power of the laser.

2. A Q-modulated semiconductor laser as defined in claim 1, wherein said second partially reflecting element coupling the first and the second optical waveguide segments is an etched trench with substantially vertical sidewalls.

3. A Q-modulated semiconductor laser as defined in claim 2, wherein the etched trench has a size that is substantially equal to an odd-integer multiple of a quarter wavelength.

4. A Q-modulated semiconductor laser as defined in claim 1, wherein said second partially reflecting element coupling the first and the second optical waveguide segments is a distributed Bragg grating.

5. A Q-modulated semiconductor laser as defined in claim 1, wherein the optical loss of the second optical waveguide segment is changed by a current injection.

6. A Q-modulated semiconductor laser as defined in claim 1, wherein the optical loss of the second optical waveguide segment is changed by electro-absorption effect through a reverse biased voltage.

7. A Q-modulated semiconductor laser as defined in claim 1, wherein the first optical waveguide segment incorporates a distributed feedback grating.

8. A Q-modulated semiconductor laser as defined in claim 7, wherein the first resonant optical cavity further comprises a third optical waveguide segment placed between the first optical waveguide segment and the second partially reflecting element, said third optical waveguide segment being sandwiched between a pair of electrodes for providing an electrical means to adjust the effective refractive index of said third optical waveguide segment.

9. A Q-modulated semiconductor laser as defined in claim 1, wherein the first resonant optical cavity further comprises an optical filter placed between the first optical waveguide segment and the first partially reflecting element for selecting a lasing mode.

10. A Q-modulated semiconductor laser as defined in claim 9, wherein the optical filter is a third anti-resonant cavity consisting of an etched trench and a third optical waveguide segment placed between said etched trench and the first partially reflecting element.

11. A Q-modulated semiconductor laser as defined in claim 9, wherein the optical filter is a third resonant channel-selecting cavity consisting of a fourth partially reflecting element and a third optical waveguide segment placed between said fourth partially reflecting element and the first partially reflecting element, said third optical waveguide segment being sandwiched between at least a pair of electrodes for providing an optical gain as well as to change the effective refractive index of said third optical waveguide segment so that the lasing action occurs at a selectable common resonant wavelength of the first resonant optical cavity and the third resonant channel-selecting cavity.

12. A Q-modulated semiconductor laser as defined in claim 11, wherein said fourth partially reflecting element is an etched trench with substantially vertical sidewalls and of a size substantially equal to a multiple of a half wavelength.

13. A Q-modulated semiconductor laser as defined in claim 11, wherein said fourth partially reflecting element is a fourth resonant optical cavity consisting of a coupling waveguide segment bounded by two etched trenches of a size substantially equal to an odd-integer multiple of a quarter wavelength, said coupling waveguide segment having an optical path length substantially equal to a multiple of a half wavelength and having a controllable loss for obtaining high mode selectivity of the laser.

14. A Q-modulated semiconductor laser comprising:
   a first optical waveguide segment sandwiched between a first pair of electrodes for injecting current to provide optical gain, said first optical waveguide segment having a distributed feedback grating incorporated in its layer structure,
   a second optical waveguide segment connected to the first optical waveguide segment, said second optical waveguide segment being sandwiched between a second pair of electrodes for providing an electrical means to adjust the effective refractive index of said second optical waveguide segment, a third optical waveguide segment having a variable optical loss, said third optical waveguide segment being placed between two partially reflecting elements, said third optical waveguide segment being coupled to the second optical waveguide segment through one of said two partially reflecting elements, and said third optical waveguide segment being sandwiched between a third pair of electrodes for applying an electrical signal to change the optical loss of said third optical waveguide segment, and consequently to modulate the Q-factor, the threshold and the output power of the laser.

15. A Q-modulated semiconductor laser as defined in claim 14, wherein the partially reflecting element coupling the second and the third optical waveguide segments is an etched trench with substantially vertical sidewalls.

16. A Q-modulated semiconductor laser as defined in claim 15, wherein the etched trench has a size that is substantially equal to an odd-integer multiple of a quarter wavelength.

17. A Q-modulated semiconductor laser as defined in claim 14, wherein the optical loss of the third optical waveguide segment is changed by current injection.

18. A Q-modulated semiconductor laser as defined in claim 14, wherein the optical loss of the third optical waveguide segment is changed by electro-absorption effect through a reverse biased voltage.

19. A Q-modulated semiconductor laser as defined in claim 14, wherein the change of the optical loss in the third optical waveguide segment is accompanied by a change of the effective refractive index which enhances the modulation of the output power of the laser.

20. A Q-modulated semiconductor laser as defined in claim 14, wherein the second and the third optical waveguide segments incorporate distributed feedback gratings of the same period as in the first optical waveguide segment to simplify the fabrication process.

* * * * *